United States Patent
Wu et al.

(10) Patent No.: US 12,288,976 B2
(45) Date of Patent: Apr. 29, 2025

(54) ELECTRONIC FUSE BASED-PROTECTION CIRCUIT SYSTEM AND ELECTRONIC FUSE BASED-PROTECTION CIRCUIT THEREOF

(71) Applicants: Inventec (Pudong) Technology Corporation, Shanghai (CN); INVENTEC CORPORATION, Taipei (TW)

(72) Inventors: Yang Wu, Shanghai (CN); You Zhang, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 242 days.

(21) Appl. No.: 17/954,360

(22) Filed: Sep. 28, 2022

(65) Prior Publication Data
US 2024/0088646 A1     Mar. 14, 2024

(30) Foreign Application Priority Data
Sep. 8, 2022    (CN) .......................... 202211097934.2

(51) Int. Cl.
*H02H 7/20*     (2006.01)
*H02H 1/00*     (2006.01)
*H03K 17/687*   (2006.01)

(52) U.S. Cl.
CPC ............ *H02H 7/20* (2013.01); *H02H 1/0007* (2013.01); *H03K 17/687* (2013.01)

(58) Field of Classification Search
CPC ........ H02H 3/00; H02H 3/003; H02H 3/0087; H02H 7/00; H02H 7/18; H02H 7/20; H02H 5/041
USPC ............ 361/91.2, 91.5, 91.7, 91.8, 93.7, 94, 361/100–104
See application file for complete search history.

(56) References Cited

U.S. PATENT DOCUMENTS

| | | | |
|---|---|---|---|
| 7,471,017 B2 * | 12/2008 | Chen | B02C 23/04 307/326 |
| 10,044,285 B1 * | 8/2018 | Xiong | H02M 5/293 |
| 2004/0098068 A1 * | 5/2004 | Carbunaru | A61N 1/37276 607/60 |
| 2009/0045931 A1 * | 2/2009 | Liu | B60Q 1/44 340/463 |

(Continued)

*Primary Examiner* — Tuan T Dinh
(74) *Attorney, Agent, or Firm* — IPRTOP LLC

(57) ABSTRACT

An electronic fuse based-protection circuit system, including a plurality of electronic fuse based-protection circuits, where each electronic fuse based-protection circuit is electrically connected to a power supply and a load through an input terminal and an output terminal respectively and includes a sampling resistor, a MOSFET switch, and a logic control branch circuit. The sampling resistor is electrically connected to the input terminal and has a sampling terminal. The MOSFET switch is electrically connected to the sampling terminal and the output terminal. The logic control branch circuit obtains a sampling voltage of the sampling resistor between the input terminal and the sampling terminal and an on-off judging voltage by amplifying the sampling voltage. When the on-off judging voltage is greater than a reverse-bias voltage of the logic control branch circuit, an off signal is then transmitted to the MOSFET switch, to turn off the MOSFET switch.

6 Claims, 3 Drawing Sheets

(56) References Cited

U.S. PATENT DOCUMENTS

| | | | |
|---|---|---|---|
| 2018/0026437 A1* | 1/2018 | Hewelt | H01H 9/162 |
| | | | 361/41 |
| 2019/0230758 A1* | 7/2019 | Wang | H05B 45/38 |
| 2021/0405080 A1* | 12/2021 | Tang | G01N 35/00722 |
| 2022/0014178 A1* | 1/2022 | Jeong | H03H 7/427 |
| 2022/0029548 A1* | 1/2022 | Jeong | H02M 3/1588 |

* cited by examiner and chip fuses are employed. However, the traditional physical fuses are single-use fuses, meaning that when the power is too large, a physical fusing will occur and then result in a broken circuit after which the circuit cannot be connected again. Afterward, it is necessary to suspend the operation of the protected electronic device to replace the traditional physical fuse for restoring the protection of the electronic device. There is no doubt that the traditional physical fuses are not suitable for electronic devices which need to operate continuously for a long time or are inconvenient to be suspended during operation, and the vehicle electronic devices belong to the latter.

ELECTRONIC FUSE BASED-PROTECTION CIRCUIT SYSTEM AND ELECTRONIC FUSE BASED-PROTECTION CIRCUIT THEREOF

CROSS REFERENCE TO RELATED APPLICATION

The present application claims the benefit of priority to Chinese Patent Application No. CN 202211097934.2, entitled "ELECTRONIC FUSE BASED-PROTECTION CIRCUIT SYSTEM AND ELECTRONIC FUSE BASED-PROTECTION CIRCUIT THEREOF", filed with CNIPA on Sep. 8, 2022, the disclosure of which is incorporated herein by reference in its entirety.

FIELD OF TECHNOLOGY

The present invention relates to the field of protection circuit system and protection circuit thereof, particularly to an electronic fuse based-protection circuit system and an electronic fuse based-protection circuit thereof.

BACKGROUND

Generally speaking, electronic devices usually have to equip a built-in or external power supply to operate normally, where the built-in power supply is usually a battery or large-capacity super capacitor installed inside the electronic device and discharges through a specific power management system. Batteries or large-capacity super capacitors usually discharge in a form of direct current relatively stably to the electronic elements inside the electronic devices.

However, in some special cases, it is not guaranteed that the power supply can discharge stably to the electronic elements inside the electronic devices even if it discharges in the form of direct current, where a typical example is a in-vehicle power supply. The in-vehicle power supply can be a battery installed in the fuel vehicle, or large-capacity capacitors connected in series, parallel, or series-parallel which are installed in the electric vehicle.

For the battery in the fuel vehicle, it will charge and discharge continuously during the driving of the fuel vehicle, moreover, the vehicle body will vibrate continuously, therefore, the contact conditions between the electronic elements and various cables change continuously, which makes it difficult to control a stable discharge of the battery to the related electronic elements. For the electric vehicle with multiple large-capacity capacitors, the vehicle body will also vibrate continuously during the driving, therefore, the contact conditions of multiple electrodes, various cables, and electronic elements change continuously, which also makes it difficult to control actual charging and discharging conditions of the multiple large-capacity capacitors (including voltage and current of charging and discharging).

Under the above background, it is necessary to provide an appropriate protection circuit to protect a specific load installed in the vehicle (i. e., the in-vehicle electronic device), so that the vehicle electronic device can be prevented from being damaged when the power supply provides an abnormal working power to the in-vehicle electronic device (e. g., electronic tire pressure sensor, electronic instrument panel, head-up display device, vehicle radar, etc.).

In the existing protection circuit, traditional physical fuses (commonly known as fuse wires) such as glass tube fuses and chip fuses are employed. However, the traditional In order to overcome the problem of traditional physical fuses, an electronic fuse chip that can be used multiple times was then developed. The main principle of the electronic fuse chip is monitoring the change of power, comparing the power through a comparator of a logic circuit, and cutting off the power supply applied to a load through an electronic switch when a detected voltage or current is greater than a default reference value (reference voltage or reference current). However, a long time is needed for the comparison of the logic circuit. Once a momentary large current flows to the load, the power supply cannot be cut off in the shortest time considering the long comparison time, and the load may be damaged which leads to a limited protection effect.

SUMMARY

The present invention provides an electronic fuse based-protection circuit.

The electronic fuse based-protection circuit includes an input terminal and an output terminal, where the input terminal and the output terminal are electrically connected to a power supply and a load, respectively, to receive a working power provided by the power supply and transmit the working power to the load or interrupt the transmission of the working power to the load controllably. The electronic fuse based-protection circuit further includes a sampling resistor, a metal-oxide-semiconductor field-effect transistor (MOSFET) switch (hereinafter referred to as MOSFET switch), a logic control branch circuit, and a power monitoring module.

One end of the sampling resistor is electrically connected to the input terminal, and another end remote from the input terminal of the sampling resistor is a sampling terminal. The MOSFET switch is electrically connected to the sampling terminal and the output terminal. The logic control branch circuit includes a gain amplifier, a reverse-bias diode, and an on-off signal transmitting transistor.

The gain amplifier is electrically connected to the input terminal and the sampling terminal to obtain a sampling voltage of the sampling resistor between the input terminal and the sampling terminal, and then obtain an on-off judging voltage by amplifying the sampling voltage. The reverse-bias diode is electrically connected to the gain amplifier and has a reverse-bias voltage. When the on-off judging voltage is greater than the reverse-bias voltage, the reverse-bias diode will be turned on.

The on-off signal transmitting transistor is electrically connected to the reverse-bias diode and the MOSFET switch, and transmits an off signal to the MOSFET switch when the reverse-bias diode is turned on, to turn off the MOSFET switch, so that the transmission of the working power to the load is interrupted to protect the load from being damaged by the working power.

The power monitoring module is electrically connected to the MOSFET switch, and transmits an on signal to the MOSFET switch to turn on the MOSFET switch when the detected working power is less than an allowable working power, so that the transmission of the working power to the load is restored.

In an embodiment, when the electronic fuse based-protection circuit of the present invention is applied to the in-vehicle electronic devices, the above load may be an in-car radar.

In an embodiment, the power monitoring module may include a micro control unit (MCU) electrically connected to the gain amplifier.

In an embodiment, the gain amplifier may also be used to obtain a sampling current flowing through the sampling resistor when the MOSFET switch is turned off, and to obtain an on-off judging current by amplifying the sampling current so as to transmit the on-off judging current to the MCU, so that when the MCU judges that the on-off judging current is less than a preset critical current, it indicates that the working power is less than the allowable working power, and then the on signal is transmitted accordingly.

Based on the above-mentioned fuse based-protection circuit, the present invention provides another technical solution, i.e., an electronic fuse based-protection circuit system.

The electronic fuse based-protection circuit system includes a plurality of the electronic fuse based-protection circuit.

In an embodiment, the electronic fuse based-protection circuit system may include fourteen or other number of electronic fuse based-protection circuits, and each of the fourteen or other number of electronic fuse based-protection circuits may operate independently.

As described above, the electronic fuse based-protection circuit and the electronic fuse based-protection circuit system provided by the present invention obtain the on-off judging voltage after the gain amplification of the sampling resistance, turn on the reverse-bias diode when the on-off judging voltage is greater than the reverse-bias voltage, and then turn off the MOSFET switch, i.e., the MOSFET switch is turned off by using a natural physical phenomenon. There is no doubt that neither complex analogue or substantive comparison of digital signals is involved in the present invention, nor a comparison of complex numerical operations is involved in the present invention, so that the MOSFET switch can be quickly turned off within the shortest time when the working power is overhigh to realize a better protection effect.

REFERENCE NUMERALS

100—electronic fuse based-protection circuit system,
1, 1a~1n—electronic fuse based-protection circuit,
11—input terminal,
12—output terminal,
13—sampling resistor,
131—sampling terminal,
14—MOSFET switch,
15—logic control branch circuit,
151—gain amplifier,
152—reverse-bias diode,
153—on-off signal transmitting transistor,
16—power monitoring module,
161—MCU,
2—power supply,
3, 3a~3n—load,
WP—working power,
S1—off signal,
S2—on signal.

DETAILED DESCRIPTION

The electronic fuse based-protection circuit system and the electronic fuse based-protection circuit thereof provided by the present invention can be widely used to protect various electronic devices, especially for protecting in-vehicle electronic devices. And only one embodiment of the electronic fuse based-protection circuit and the electronic fuse based-protection circuit system will be specifically described herein to avoid repetition. In addition, the diagrams in each embodiment are simplified, where the components are not presented based on an absolutely accurate ratio in use, but are only used to assist in explaining the purpose and efficacy of the embodiments of the present invention conveniently and clearly.

Figure 1:
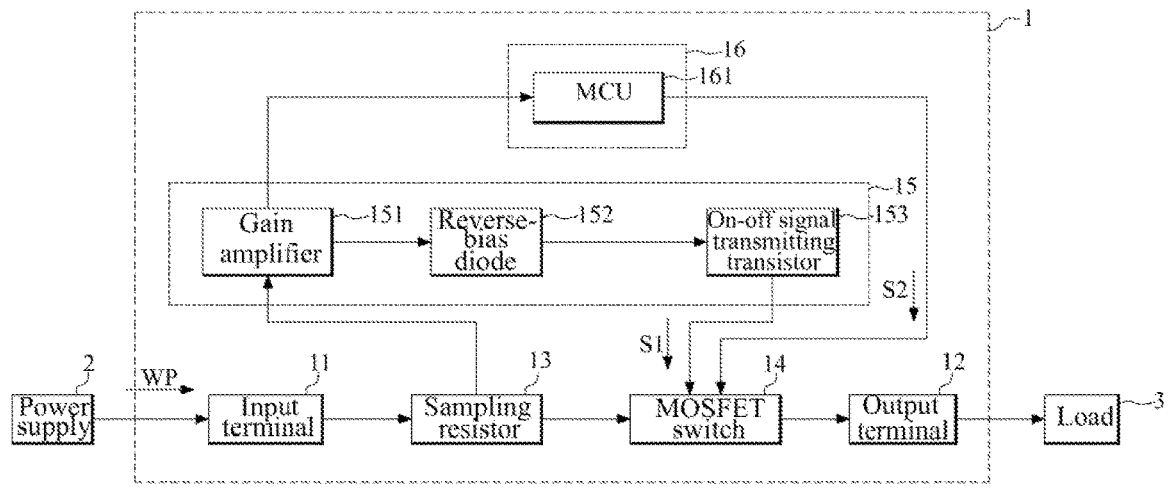
FIG. 1 shows a function block diagram of an electronic fuse based-protection circuit according to an embodiment of the present invention.
Figure 2A:
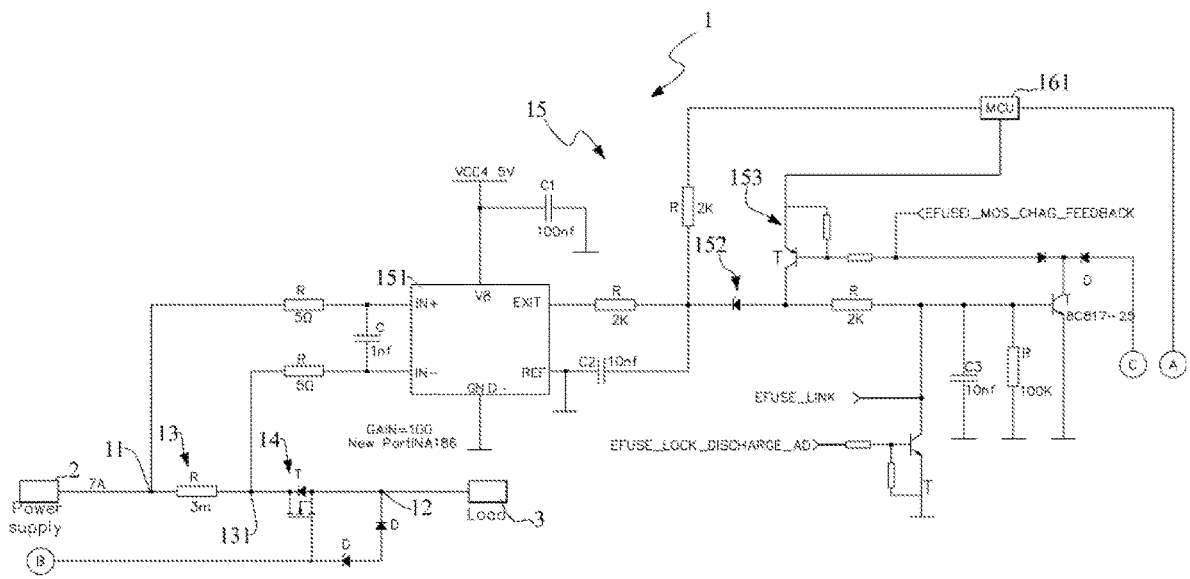
FIG. 2A and FIG. 2B show schematic circuit diagrams of electronic fuse based-protection circuits according to an embodiment of the present invention.
Figure 2B:
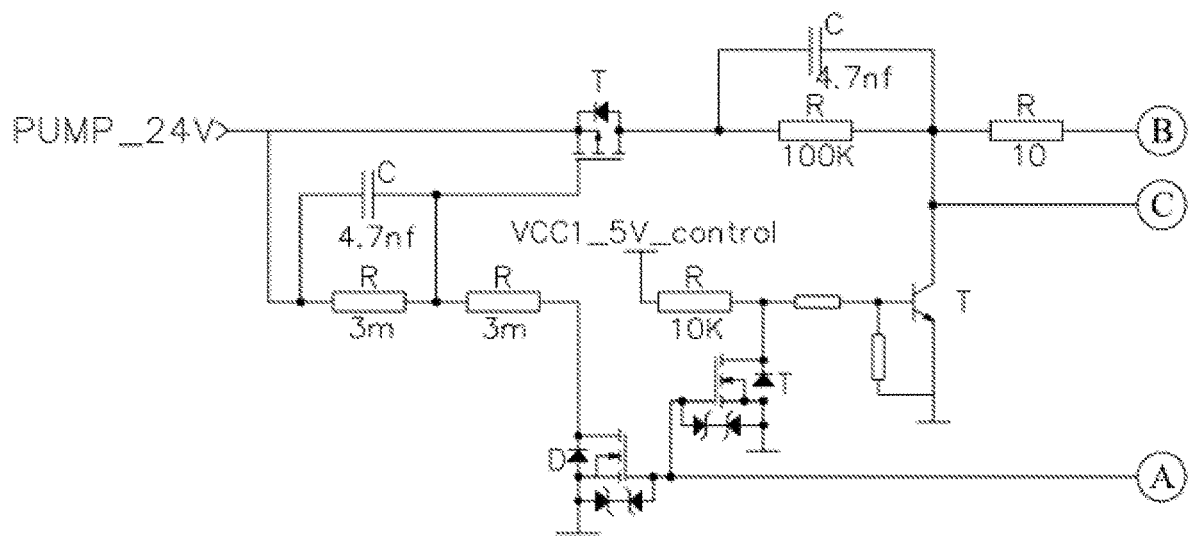

Please refer to FIGS. 1, 2A and 2B, FIG. 1 shows a schematic block diagram of the electronic fuse based-protection circuit according to an embodiment of the present invention, and FIGS. 2A and 2B show a schematic circuit diagram of the electronic fuse based-protection circuit according to an embodiment of the present invention. As shown in FIGS. 1, 2A and 2B, the electronic fuse based-protection circuit 1 includes an input terminal 11 and an output terminal 12, where the input terminal 11 is electrically connected to a power supply 2 and the output terminal 12 is electrically connected to a load 3 to receive a working power WP provided by the power supply 2 and to transmit the working power WP to the load 3 or interrupt the transmission of the working power WP to the load 3 in a controlled manner. The electronic fuse based-protection circuit 1 further includes a sampling resistor 13, a MOSFET switch 14, a logic control branch circuit 15, and a power monitoring module 16.

One end of the sampling resistor 13 is electrically connected to the input terminal 11, and another end remote from the input terminal of the sampling resistor 13 is a sampling terminal 131. The MOSFET switch 14 is electrically connected to the sampling terminal 131 and the output terminal 12. The logic control branch circuit 15 includes a gain amplifier 151, a reverse-bias diode 152, and an on-off signal transmitting transistor 153.

The gain amplifier 151 is electrically connected to the input terminal 11 and the sampling terminal 131 to obtain a sampling voltage of the sampling resistor 13 between the input terminal 11 and the sampling terminal 131, then the sampling voltage is amplified with a default gain value to obtain an on-off judging voltage. The reverse-bias diode 152 is electrically connected to the gain amplifier 151 and has a reverse-bias voltage. The so-called reverse-bias voltage refers to a bias voltage opposite to the current direction. When the on-off judging voltage is greater than the reverse-bias voltage, it means that the power supply 2 is currently supplying overhigh working power WP abnormally, and the reverse-bias diode 152 will be turned on naturally at this time.

The on-off signal transmitting transistor 153 is electrically connected to the reverse-bias diode 152 and the MOSFET switch 14, and transmits an off signal S1 to the MOSFET switch 14 when the reverse-bias diode 152 is turned on, to turn off the MOSFET switch 14, so that the transmission of the working power WP to the load 3 is interrupted, thereby protecting the load 3 from being damaged by the high working power WP.

The power monitoring module 16 is electrically connected to the MOSFET switch 14. In an embodiment, the power monitoring module 16 may include a micro control unit (MCU) 161 electrically connected to the gain amplifier 151. The gain amplifier 151 can also be used to obtain a sampling current flowing through the sampling resistor 13 when the MOSFET switch 14 is turned off, and obtain an on-off judging current by amplifying the sampling current, so that the on-off judging current is transmitted to the MCU 161.

When the MCU 161 judges that the on-off judging current is less than a preset critical current, it indicates that the power supply 2 has been restored and is currently supplying the working power WP normally. In this case, the MCU 161 will judge the working power WP as less than an allowable working power, indicating that the working power WP will no longer cause damage to the load 3. Therefore, the MCU 161 will transmit an on signal S2 to the MOSFET switch 14 to turn on the MOSFET switch to restore the transmission of the working power WP to the load 3.

The above-mentioned load 3 may be an in-car radar, an electronic tire pressure sensor, an electronic instrument panel, a head-up display device, and the like when the electronic fuse based-protection circuit of the present invention is applied to in-vehicle electronic devices. Each load 3 needs and can withstand different working power WP (including voltage, current, power, etc.), and each load 3 also has different internal resistance. When the sampling resistor 13 and an internal resistor of the load 3 are connected in series to form a loop, the sampling voltage is equivalent to a partial voltage between both ends of the sampling resistor 13 in the loop, and a partial voltage (applying on the load 3) of the working power WP can be calculated according to the ratio of the resistance value of the sampling resistor 13 and the resistance value of the internal resistor of the load 3.

Therefore, there is a specific proportional relationship between the sampling voltage and the partial voltage (acting on the load 3) of the working power WP. Then the sampling resistor 13 having an appropriate resistance value can be selected according to the internal resistance and the overvoltage withstanding capability of the load 3. Similarly, the gain amplifier 151 with an appropriate gain value and the reverse-bias diode 152 with an appropriate reverse-bias value can also be selected according to factors such as the internal resistance and overvoltage withstanding capability of the load 3, the operating safety, the switching sensitivity requirement of the MOSFET switch 14, etc.

Figure 3:
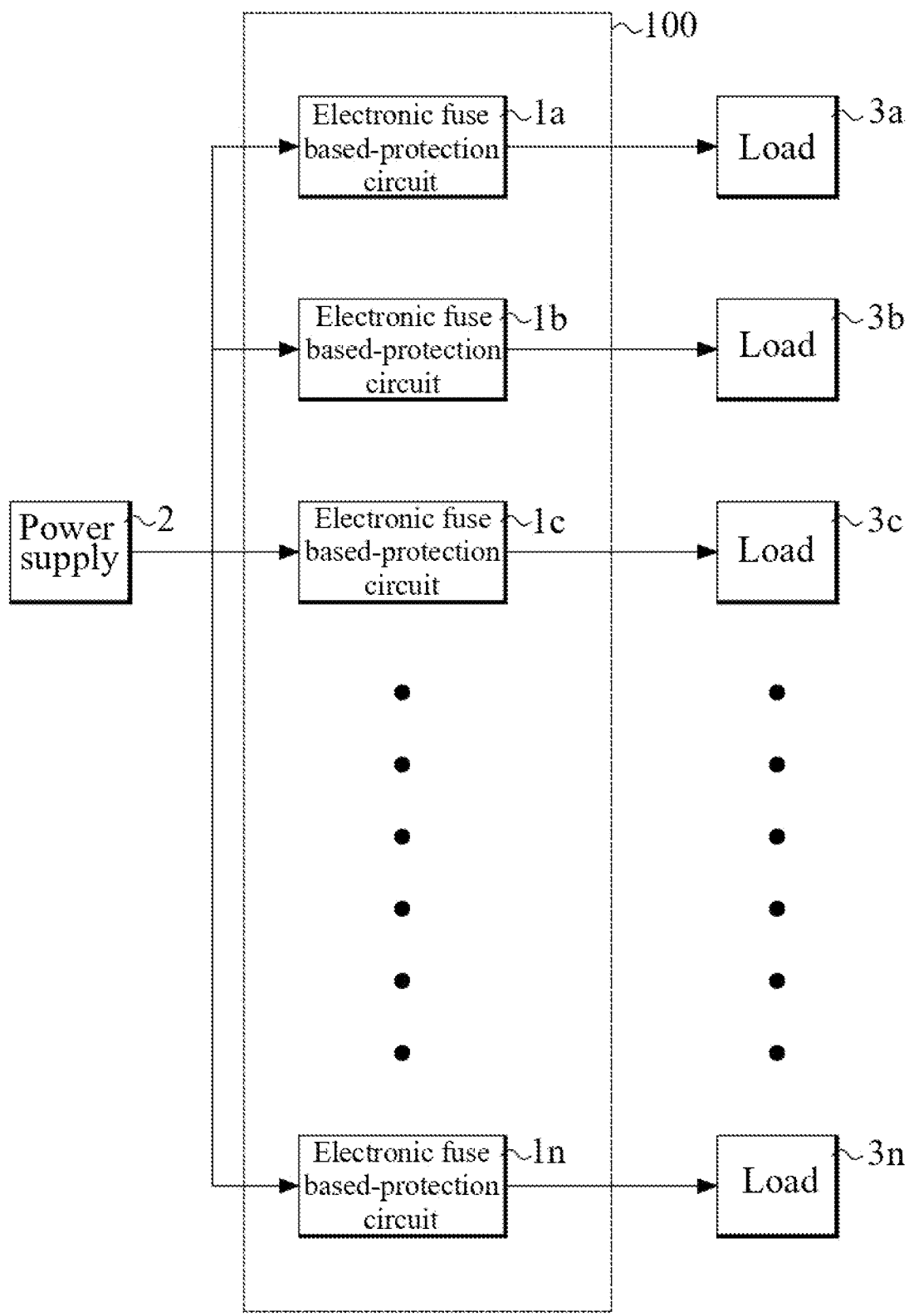
FIG. 3 shows a function block diagram of an electronic fuse based-protection circuit system according to another embodiment of the present invention.

Please refer to FIG. 3, FIG. 3 shows a schematic block diagram of an electronic fuse based-protection circuit system according to another embodiment of the present invention. As shown in FIG. 3, an electronic fuse based-protection circuit system 100 includes fourteen electronic fuse based-protection circuits 1a-1n identical to the electronic fuse based-protection circuit 1, where the fourteen electronic fuse based-protection circuits 1a-1n are respectively connected to the above-mentioned power supply 2 and fourteen loads 3a-3n. The fourteen loads 3a-3n can be exactly the same (i.e., each load is the same), partially the same (i.e., several of the loads are the same), or completely different (i.e., each load is different from other), therefore, the fourteen electronic fuse based-protection circuits 1a-1n can be matched with the fourteen loads 3a-3n to achieve an independent operation of each electronic fuse based-protection circuit, or a collaborative operation of several electronic fuse based-protection circuits. Likewise, the above-mentioned fourteen loads 3a-3n may be the in-car radar, the electronic tire pressure sensor, the electronic instrument panel, the head-up display device, and the like.

The fourteen electronic fuse based-protection circuits 1a-1n being identical to the electronic fuse based-protection circuit 1 does not mean that the resistance value of each sampling resistor in the fourteen electronic fuse based-protection circuits 1a-1n is the same as that of the electronic fuse based-protection circuit 1, the gain value of each gain amplifier in the fourteen electronic fuse based-protection circuits 1a-1n is the same as that of the electronic fuse based-protection circuit 1, nor the reverse-bias voltage of each reverse-bias diode in the fourteen electronic fuse based-protection circuits 1a-1n is the same as that of the electronic fuse based-protection circuit 1, but means that the components and the circuit connection mode in the fourteen electronic fuse based-protection circuits 1a-1n are the same as those of the electronic fuse based-protection circuit 1. In the electronic fuse based-protection circuit system 100, the selection of the resistance value, the reverse-bias voltage value, and the gain value depends on factors such as the internal resistance and overvoltage withstanding capability of each of the loads 3a-3n, the operational safety, the switching sensitivity requirement of the MOSFET switch, etc. In addition, the number of the electronic fuse based-protection circuit included in the electronic fuse based-protection circuit system 100 is not limited to 14, depending on the number of the loads to be protected.

The electronic fuse based-protection circuit 1 and the electronic fuse based-protection circuit system 100 provided by the present invention obtain the on-off judging voltage after the gain amplification of the sampling resistance, turn on the reverse-bias diode 152 when the on-off judging voltage is greater than the reverse-bias voltage, and then turn off the MOSFET switch 14, i.e., the MOSFET switch 14 is turned off by using a natural physical phenomenon. There is no doubt that neither complex analogue or substantive comparison of digital signals is involved in the present invention, nor a comparison of complex numerical operations is involved in the present invention, so that the MOSFET switch 14 can be quickly turned off within the shortest time when the working power WP is overhigh to realize a better protection effect.

The detailed description of the above embodiments is intended to illustrate the features and spirit of the present invention more clearly, rather than to limit the protection scope of the present invention, and it is worth noting that the purpose of the above embodiments is to include various changes and equivalent implementations within the protection scope of the present invention.

What is claimed is:

1. An electronic fuse based-protection circuit, comprising an input terminal and an output terminal, electrically connected to a power supply and a load, respectively, to receive a working power provided by the power supply, wherein the working power is transmitted to the load or the transmission of the working power to the load is interrupted controllably; wherein the electronic fuse based-protection circuit further comprises:

a sampling resistor, wherein one end of the sampling resistor is electrically connected to the input terminal, and another end remote from the input terminal of the sampling resistor is a sampling terminal;

a metal-oxide-semiconductor field-effect transistor switch, electrically connected to the sampling terminal and the output terminal;

a logic control branch circuit, which comprises:
   a gain amplifier, electrically connected to the input terminal and the sampling terminal, to obtain a sampling voltage of the sampling resistor between the input terminal and the sampling terminal and then obtain an on-off judging voltage by amplifying the sampling voltage;
   a reverse-bias diode, electrically connected to the gain amplifier, wherein the reverse-bias diode has a reverse-bias voltage and is turned on when the on-off judging voltage is greater than the reverse-bias voltage;
   an on-off signal transmitting transistor, electrically connected to the reverse-bias diode and the metal-oxide-semiconductor field-effect transistor switch, wherein the on-off signal transmitting transistor transmits an off signal to the metal-oxide-semiconductor field-effect transistor switch to turn off the metal-oxide-semiconductor field-effect transistor switch when the reverse-bias diode is turned on, so that the transmission of the working power to the load is interrupted and the load is protected from being damaged by the working power; and
   a power monitoring module, electrically connected to the metal-oxide-semiconductor field-effect transistor switch, wherein the power monitoring module transmits an on signal to the metal-oxide-semiconductor field-effect transistor switch to turn on the metal-oxide-semiconductor field-effect transistor switch when a detected working power is less than an allowable working power, so that the transmission of the working power to the load is restored.

2. The electronic fuse based-protection circuit according to claim 1, wherein the load is an in-car radar.

3. The electronic fuse based-protection circuit according to claim 2, wherein the power monitoring module comprises a micro control unit electrically connected to the gain amplifier; wherein the gain amplifier is further configured to obtain a sampling current flowing through the sampling resistor when the metal-oxide-semiconductor field-effect transistor switch is turned off, and to obtain an on-off judging current by amplifying the sampling current so that the on-off judging current is transmitted to the micro control unit, so that when the micro control unit judges that the on-off judging current is less than a preset critical current, it indicates that the working power is less than the allowable working power, and then the on signal is transmitted accordingly.

4. An electronic fuse based-protection circuit system, comprising a plurality of the electronic fuse based-protection circuits according to claim 1, wherein the plurality of the electronic fuse based-protection circuits are electrically connected to the power supply and a plurality of the loads, respectively.

5. The electronic fuse based-protection circuit system according to claim 4, wherein each of the plurality of electronic fuse based-protection circuits operates independently.

6. The electronic fuse based-protection circuit system according to claim 4, wherein the number of the electronic fuse based-protection circuits is 14.

* * * * *